United States Patent [19]
Hagiiiri-Teiirani et al.

[11] Patent Number: 5,514,240
[45] Date of Patent: May 7, 1996

[54] METHOD FOR INCORPORATING A CARRIER ELEMENT

[75] Inventors: Yahya Hagiiiri-Teiirani, Munich; Renee-Lucia Barak, Unterhaching, both of Germany

[73] Assignee: GAO Gesellschaft für Automation und Organisation mbH, Germany

[21] Appl. No.: 237,154

[22] Filed: May 3, 1994

Related U.S. Application Data

[63] Continuation of Ser. No. 906,444, Jun. 30, 1992, abandoned.

[30] Foreign Application Priority Data

Jul. 3, 1991 [DE] Germany ............... 41 22 049.8

[51] Int. Cl.$^6$ ............................ B32B 31/18
[52] U.S. Cl. ............ 156/252; 156/247; 156/248; 156/249; 156/256; 156/261; 156/230; 156/238; 257/679; 283/904
[58] Field of Search ............... 156/252, 256, 156/261, 262, 297, 248, 249, 248, 249, 230, 238; 283/904; 257/679

[56] References Cited

U.S. PATENT DOCUMENTS

| | | | |
|---|---|---|---|
| 3,558,388 | 1/1971 | Somerville | 156/249 X |
| 3,765,992 | 10/1973 | Stageberg | 156/248 X |
| 3,886,012 | 5/1975 | Slater | 156/73.1 |
| 3,932,253 | 1/1976 | Elarde et al. | 156/249 |
| 4,457,798 | 7/1984 | Hoppe et al. | 283/904 X |
| 4,474,292 | 10/1984 | Haghiri-Tehrani et al. | 283/904 X |
| 4,552,383 | 11/1985 | Hoppe et al. | 283/904 X |
| 4,599,125 | 8/1986 | Buck | 156/248 |
| 4,643,789 | 2/1987 | Parker et al. | 156/219 |
| 4,649,418 | 3/1987 | Uden | 357/80 |
| 4,701,236 | 10/1987 | Vieilledent | 156/252 |
| 4,746,392 | 5/1988 | Hoppe | 156/244 |
| 4,788,102 | 11/1988 | Koning et al. | 283/904 X |
| 4,834,821 | 5/1989 | Maligie | 156/248 X |
| 4,854,998 | 8/1989 | Yamaguchi | 156/248 |
| 4,897,534 | 1/1990 | Haghiri-Tehrani | 235/488 |
| 5,026,452 | 6/1991 | Kodai | 283/904 X |
| 5,027,190 | 6/1991 | Haghiri-Tehrani et al. | 357/74 |
| 5,149,387 | 9/1992 | Moore, Sr. | 156/241 |
| 5,252,167 | 10/1993 | Hoppe et al. | 156/261 |

FOREIGN PATENT DOCUMENTS

| | | |
|---|---|---|
| 0201952 | 11/1986 | European Pat. Off. . |
| 4040770 | 6/1992 | Germany . |
| 3-112690 | 5/1991 | Japan ................. 283/904 |

*Primary Examiner*—David A. Simmons
*Assistant Examiner*—M. Curtis Mayes
*Attorney, Agent, or Firm*—Bacon & Thomas

[57] ABSTRACT

The invention relates to a method for incorporating a carrier element or module in a card body. The card body is provided with a recess shaped accordingly for incorporating the carrier element. The carrier element comprises a substrate on which an integrated circuit is disposed. Before the carrier element is incorporated a contact adhesive element is first introduced into the recess by means of a suitable tool. The carrier element can then be connected firmly and permanently with the card body with the aid of the contact adhesive element under the action of pressure.

14 Claims, 4 Drawing Sheets

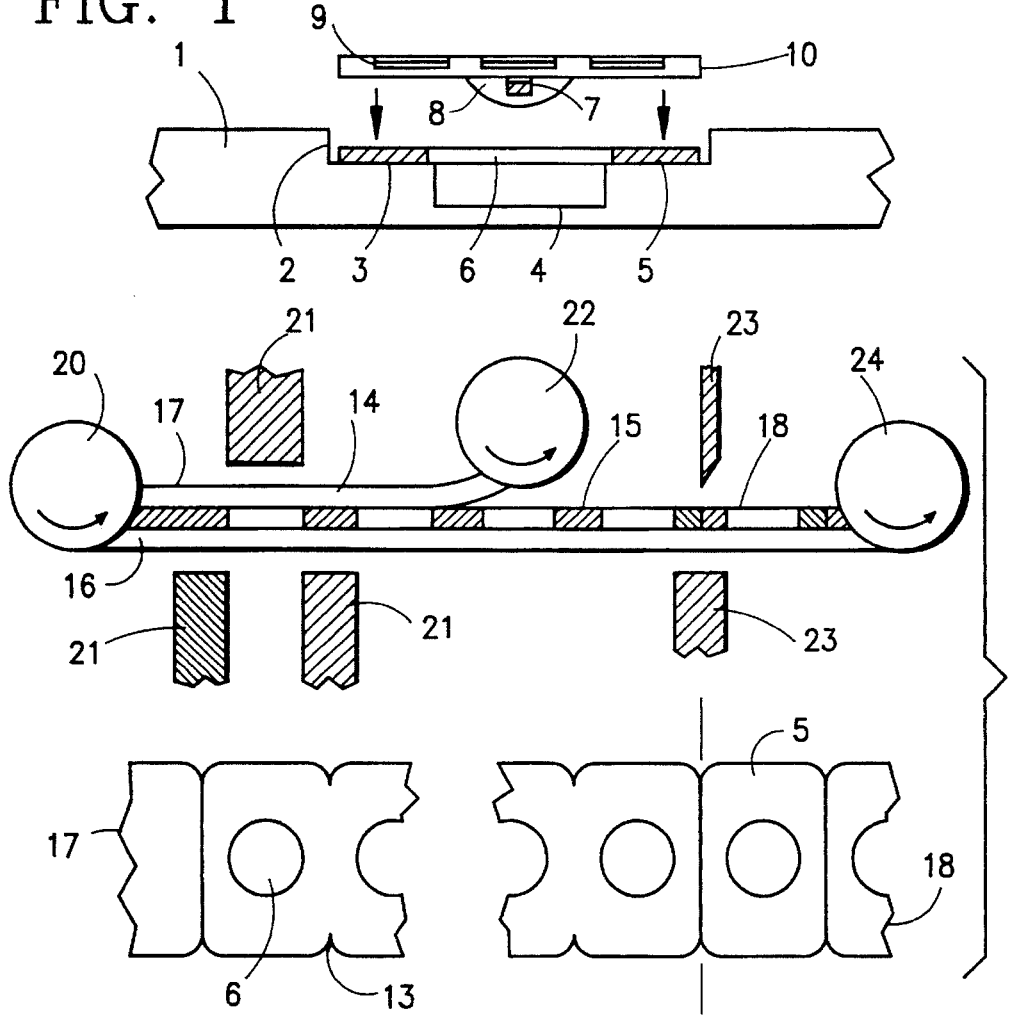
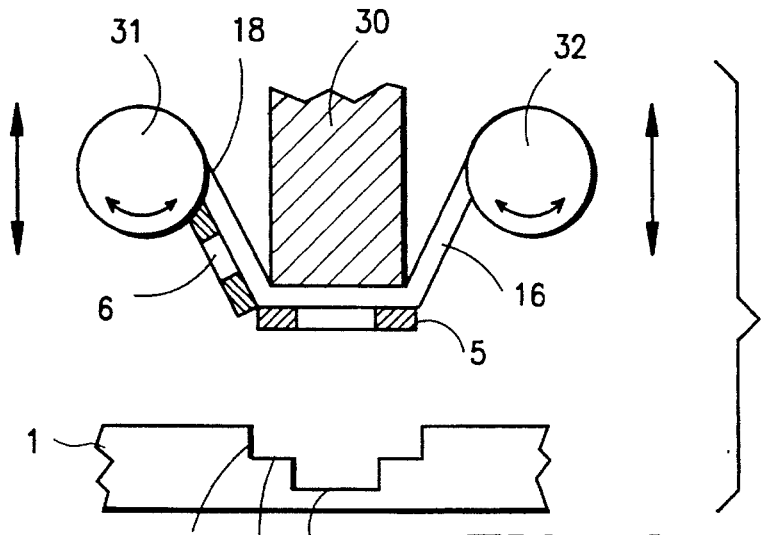

METHOD FOR INCORPORATING A CARRIER ELEMENT

This application is a Continuation of application Ser. No. 07/906,444, filed Jun. 30, 1992 now abandonment

BACKGROUND OF THE INVENTION

The present invention relates to a method for incorporating a carrier element in a card body and to a semifinished product in the form of a card body.

In the production of identity cards that are used as personal I.D., credit cards, debit cards or the like, the carrier element is connected with the card body for example in a recess provided in the card for taking up a module or carrier element. One possibility, for example, is to connect a carrier element or a module with the card body permanently with the aid of an adhesive layer.

Known methods for incorporating a carrier element or module in a card body chiefly use hot-sealing adhesives or contact adhesives. Unlike contact adhesive, hot-sealing adhesive must be thermally activated, i.e. the components can only bond under the action of heat. The necessary heat can be supplied to the hot-sealing adhesive for example via suitable heat dies. Contact adhesive offers the advantage over hot-sealing adhesive that a good and permanent bond can be had without the action of heat. However, since contact adhesive is already adhesive at normal temperature it is more difficult to handle during the method steps; for example contact adhesive can stick to the machine parts in undesirable fashion.

The modules or carrier elements, that are preferably stamped out of an endless film, generally comprise a substrate on which one or more integrated circuits are connected with strip conductors. The strip conductors lead to contact surfaces located on the substrate that permit communication with corresponding devices. The IC module and the strip conductors leading from the IC module to the contact surfaces can be surrounded by a casting compound as protection from mechanical loads.

A representative example of the many known methods for incorporating a carrier element or module in a card body is the method known from EP-A 0 201 952. In this method a carrier element or module is connected with the card body in a recess in the card with the aid of a contact adhesive disposed on the carrier element. The method steps are as follows. Circular openings are stamped in a contact adhesive tape comprising a double-sided contact adhesive film that is covered on each side by a protective film. The contact adhesive tape provided with the openings is brought together with a carrier film on which the integrated circuits are mounted, and connected therewith after a first protective film is removed. The carrier film is sprayed with a protective layer, whereby the contact adhesive film covered by a second protective film forms a mask that covers the areas not to be sprayed. Before the carrier elements are stamped out with the corresponding contact adhesive rings the second protective film is removed. In an additional working step the contact adhesive film connected with the carrier film is brought together and connected with a third protective film. The contact adhesive film is thereby covered by the third protective film in such a way that the contact adhesive rings provided for connecting the carrier elements with the card bodies are not covered when the carrier elements are stamped out. The third protective film prevents the contact adhesive film from sticking to the card body or to the die-plate of the stamping die when the carrier elements are stamped out.

The method has the disadvantage that very precise positioning is required to bring together or connect the additionally used third protective film with the contact adhesive film so that the adhesive surfaces of the contact adhesive rings are not covered by the protective film. Furthermore, the known method has the disadvantage that the additionally applied third protective film creates a distance between the punch and the die-plate when the carrier elements are stamped out, so that fuzzy edges are obtained in the stamping operation. This can lead for example to fuzzy stamping contours.

The invention is based on the problem of facilitating the incorporation of a carrier element in a card body while simultaneously obtaining a good and permanent bond between the carrier element and the card body.

BRIEF SUMMARY OF THE INVENTION

The invention starts out from a carrier film present in an endless form with integrated circuits mounted thereon, whereby the circuits can each be surrounded by a casting compound. The carrier elements are stamped out of the carrier film with a suitable stamping die and incorporated in a card body provided with a recess. Before incorporating the carrier elements one applies a double-sided contact adhesive element by means of a suitable tool to the surfaces of the recess provided for the bond with the module. With the aid of the contact adhesive element the carrier element can be connected firmly and permanently with the card body under the action of pressure.

In the inventive method for incorporating a carrier element the contact adhesive element is first incorporated in the recess in the card body provided therefor, and then the carrier element. This makes it possible to work on the contact adhesive tape and the carrier film independently of each other. The carrier elements can accordingly be stamped out of the carrier film without the contact adhesive film. This has the advantage of preventing the contact adhesive film from sticking undesirably to the stamping die during the stamping operation. After the protective film is removed the contact adhesive film located on a carrier film is worked on in a separate method step by means of a suitable cutting tool to obtain the individual contact adhesive elements provided for connecting the carrier elements with the card bodies. This procedure facilitates the handling of the contact adhesive tape during the method steps. In a following working step the contact adhesive elements can be transferred from the carrier film without any trouble directly into the recess in an accurate fit by means of a suitable tool. The inventive method thus permits a simple and unproblematic incorporation of carrier elements in card bodies.

The contact adhesive elements provided for connecting the carrier elements with the card bodies are produced according to the inventive method in the following way from a contact adhesive tape present in the form of endless material and comprising a carrier film with a double-sided contact adhesive film located thereon that is covered by at least one protective film. According to a first embodiment the areas of the contact adhesive tape not required as adhesive surfaces for connecting the carrier elements with the card bodies are stamped out by means of a stamping die. After the protective film is removed a suitable cutting tool is used to cut the contact adhesive film at regular intervals in exact register, i.e. in accordance with the dimensions of the adhesive surfaces provided for the bond between the carrier elements and the card bodies, to obtain the individual contact adhesive elements. In a second embodiment a protective film is first removed from the contact adhesive tape and the contact adhesive film cut in accordance with the contour selected for the contact adhesive elements in such a way that the elements are surrounded by a lattice. In the next working step the latticed contact adhesive film is removed to obtain the contact adhesive elements remaining isolated on the carrier film at regular intervals. Although this embodiment is more elaborate in its production than the first embodiment it has the advantage of permitting simpler incorporation of the contact adhesive elements in the card bodies. According to a development of the second embodiment the carrier film of the contact adhesive tape can additionally be provided with T-shaped recesses. This embodiment has the additional advantage that the contact adhesive elements can be inserted into deeper cavities in the card without strong wrinkle formation in the carrier film at the ends of the cavity leading to processing problems. This embodiment is advantageous in particular for IC modules with thick edge areas and for platelike IC modules.

The contact adhesive elements can also be inserted into a recess in the card together with the carrier film as a protective layer with the aid of a suitable stamping die.

According to a further embodiment of the invention the multistep recess of a card body provided with transparent cover layers is designed in such a way that the bottom of the recess protruding into the transparent layer on the back is invisible due to a covering element placed on the back of the card body, for example a so-called signature stripe.

BRIEF DESCRIPTION OF THE DRAWINGS

Further advantages and developments of the invention emerge from the subclaims and the embodiment examples that are described in the following with reference to the figures, in which:

FIG. 1 shows in cross section a card body with an incorporated contact adhesive element and a carrier element to be incorporated, FIGS. 2 to 3 show a method for incorporating a carrier element in a card body.

DETAILED DESCRIPTION OF THE PREFERRED EMBODIMENTS

Figure 4:
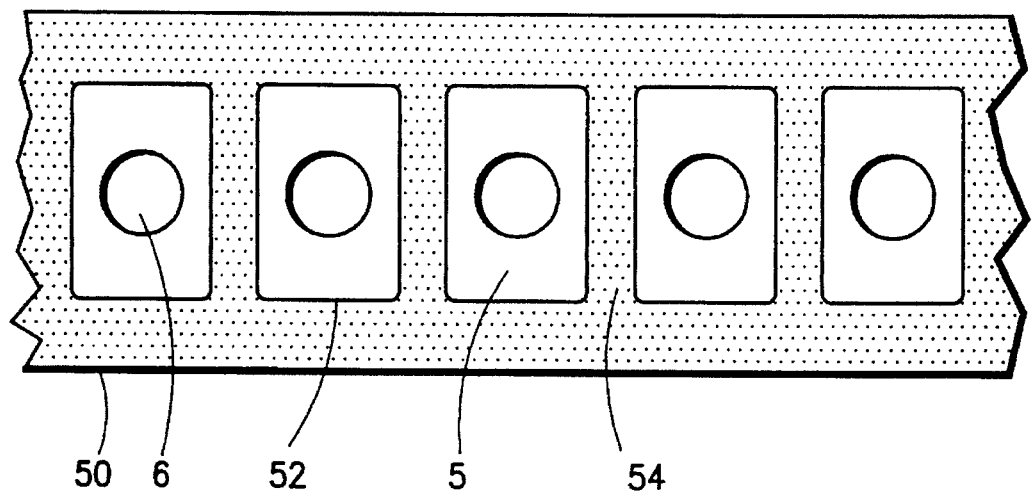
FIG. 4 shows a further embodiment of a contact adhesive tape.

FIG. 1 shows a sectional view of a card body 1 with a recess 2. Recess 2 is designed in a preferred embodiment as a two-step recess having a first recess 3 and a deeper second recess 4 disposed within first recess 3. On the shoulder areas of deeper recess 4 there is a double-sided contact adhesive element 5 that is provide with an opening 6. Card body 1 can be constructed of only one or of several layers. Recess 2 can for example be milled into card body 1 in a one-layer card with a corresponding tool. Recess 2 serves to take up a carrier element 10, first recess 3 serving to take up the substrate and second recess 4 to take up integrated circuit 7.

Carrier element 10 comprises a substrate on which an integrated circuit 7 is disposed. To be protected from mechanical loads integrated circuit 7 can be surrounded by a casting compound 8, for example a casting resin. Integrated circuit 7 is connected via strip conductors or bonding wires (not shown) with contact surfaces 9 located on the substrate.

With reference to FIGS. 2 and 3 the inventive method for incorporating carrier element 10 in recess 2 of card body 1 shall be explained in the following. FIG. 2 shows a contact adhesive tape 17 unreeled from a roll 20 and present in an endless form. Contact adhesive tape 17 comprises a carrier film 16 with a double-sided contact adhesive film 15 located thereon that is covered by a protective film 14. Circular openings 6 are stamped out of contact adhesive tape 17 at regular intervals in the center area with a suitable stamping die 21, and round indents 13 at the edges that are not required as adhesive surfaces for the bond between the carrier elements and the card bodies. Protective film 14 can then be removed from contact adhesive tape 17 and wound onto a roll 22. Suitable guide rolls (not shown) can be provided for conveying contact adhesive tape 17, whereby stamped openings 6 can be utilized for clocked transport and positioning of contact adhesive tape 17. After contact adhesive tape 17 has been positioned contact adhesive film 15 is cut with the aid of a suitable cutting tool 23 at regular intervals in exact register, i.e. in accordance with the dimensions of the adhesive surfaces provided for the bond between the carrier elements and the card bodies, to obtain individual contact adhesive elements 5 provided for incorporation in the card bodies. Contact adhesive tape 18 obtained after cutting operation 23 can be wound onto a roll 24 for stock keeping. But contact adhesive tape 18 can also be fed for further processing directly to the method step shown in FIG. 3.

FIG. 3 shows a schematic representation of the incorporation of contact adhesive element 5 in recess 3 of card body 1. Contact adhesive tape 18 located on roll 31 is fed to roll 32, thereby connecting the two rolls. Contact adhesive tape 18 and card body 1 are positioned relative to each other in such a way that contact adhesive element 5 is inserted from carrier film 16 directly into recess 3 of the card body in an accurate fit by means of die 30 and connected firmly and permanently with card body 1 under the action of a pressure exerted by the die. Carrier film 16 remaining after incorporation of contact adhesive elements 5 is wound onto roll 32. Die 30 and rolls 31 and 32 can be moved in both directions independently of each other. Rolls 31 and 32 can move downward in case of an excessive load on contact adhesive tape 18 due to downward moving die 30. This prevents the tape from tearing due to impermissible load. To improve the guidance of contact adhesive tape 18 one can also provide suitable guide rolls (not shown).

To obtain a finished identity card, carrier element 10 shown in FIG. 1 is incorporated into recess 2 in card body 1 by a tool not shown. With the aid of contact adhesive element 5 and under the action of pressure carrier element 10 can be connected firmly and permanently with card body 1. In a preferred embodiment contact adhesive element 5 is provided with a opening 6 that prevents casting compound 8 from sticking to card body 1 in the area of recess 4. Deeper recess 4 can be dimensioned here such that a cavity can remain in recess 4 below casting compound 8 upon incorporation of carrier element 10. This permits a certain freedom of movement for carrier element 10, having in particular a relieving effect on integrated circuit 7 in case of bending stresses on card 1. The recess in the card body shown with two steps in the embodiment example can of course be designed with one step if the form selected for the carrier element is that of a plate or wafer. In this case the opening in the contact adhesive element can be omitted since the carrier element is then connected over the entire surface with the bottom of the recess.

FIG. 4 shows a further embodiment of a contact adhesive tape. Circular openings 6 can be stamped by a corresponding stamping die, as already described with reference to FIG. 2, out of contact adhesive tape 50 that comprises a carrier film, a double-sided contact adhesive film disposed thereon, and at least one protective film.

The protective film is then removed and the contact adhesive film cut with a suitable cutting tool in accordance with selected contour 52 of the adhesive surfaces provided for the bond between the carrier elements and the card bodies in such a way that isolated contact adhesive elements 5 are surrounded in latticed fashion by the contact adhesive film in areas 54. In the next working step the contact adhesive film is removed in latticed fashion in areas 54 to permit insertion of individual contact adhesive elements 5 remaining on the carrier film at regular intervals into the recesses in the card bodies in accordance with the method step shown in FIG. 3. This embodiment has the advantage that the individual contact adhesive elements can be inserted into the recesses in the card bodies more easily.

Figure 5:
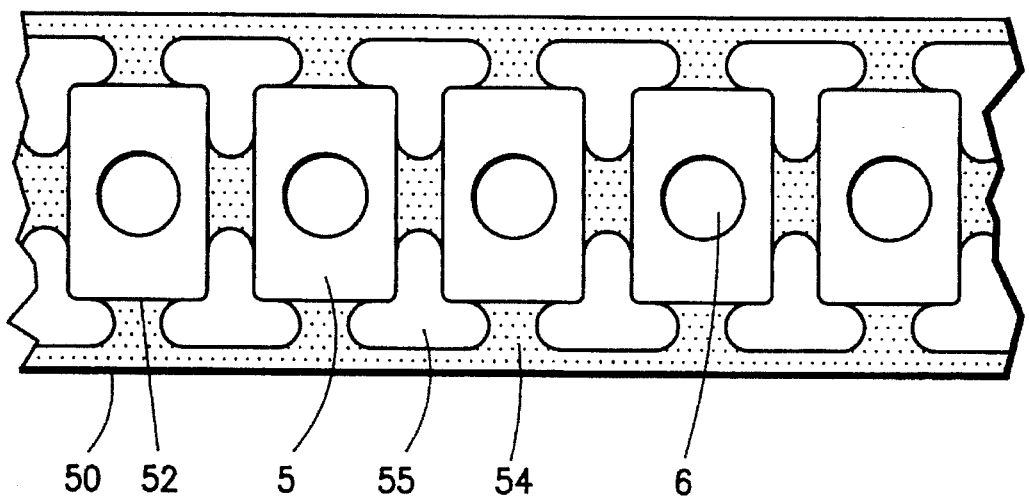
FIG. 5 shows a development of the contact adhesive tape shown in FIG. 4.

FIG. 5 shows a development of contact adhesive tape 50 shown in FIG. 4. Contact adhesive tape 50 produced according to FIG. 4 can be provided additionally with T-shaped relief openings 55 that are stamped out of the carrier film located in areas 54 by means of a suitable stamping die. This embodiment has the additional advantage that contact adhesive elements 5 can be inserted into deeper cavities in the card without strong wrinkle formation in the carrier film at the ends of the cavities leading to processing problems. This embodiment is advantageous in particular for carrier elements with thick edge areas and for platelike or waferlike carrier elements or IC modules.

Figure 6:
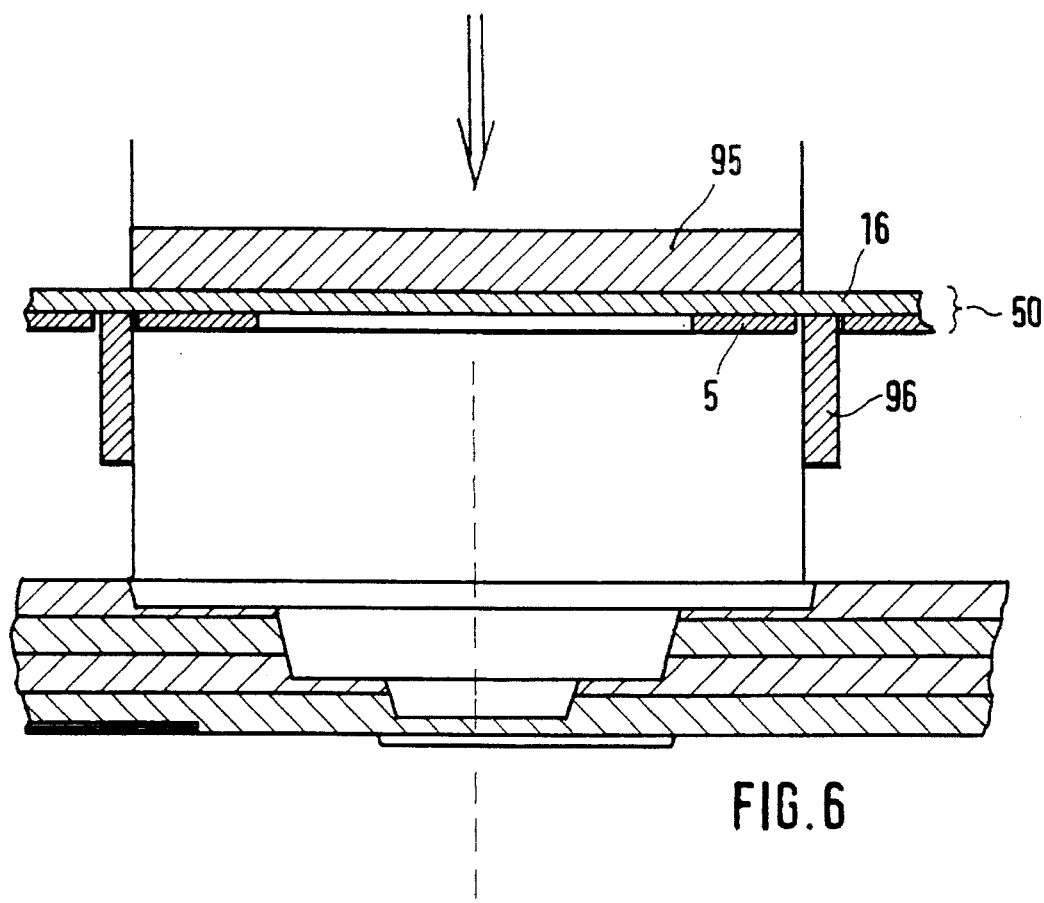
FIG. 6 shows a stamping die for incorporating a contact adhesive element with a protective film in the card body.

Contact adhesive element 5 can also be inserted into a recess in the card with a protective film (see FIG. 6, cross section through a multilayer card). For this purpose contact adhesive tape 50 is prepared for example in accordance with the description of FIG. 4. This tape, comprising carrier film 16 and contact adhesive elements 5 spaced apart thereon, is fed to a stamping die 95, 96. This tool stamps out the tape elements that are slightly larger than the contour of contact adhesive elements 5. The stamped elements are inserted directly into the recess in the card. In this procedure the inserted contact adhesive elements are protected from dirt. The card bodies with their inserted contact adhesive elements can thus be stored for any desired length of time. The protective film is removed Immediately before incorporation of the module.

Figure 7:
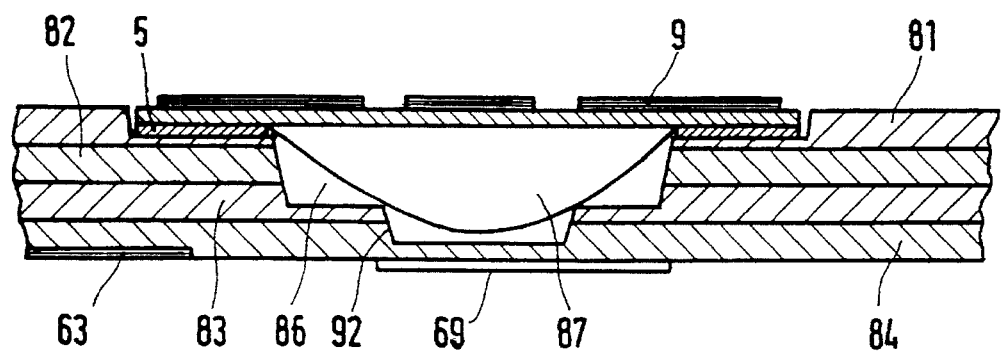
FIG. 7 shows a cross section through a card body.
Figure 8:
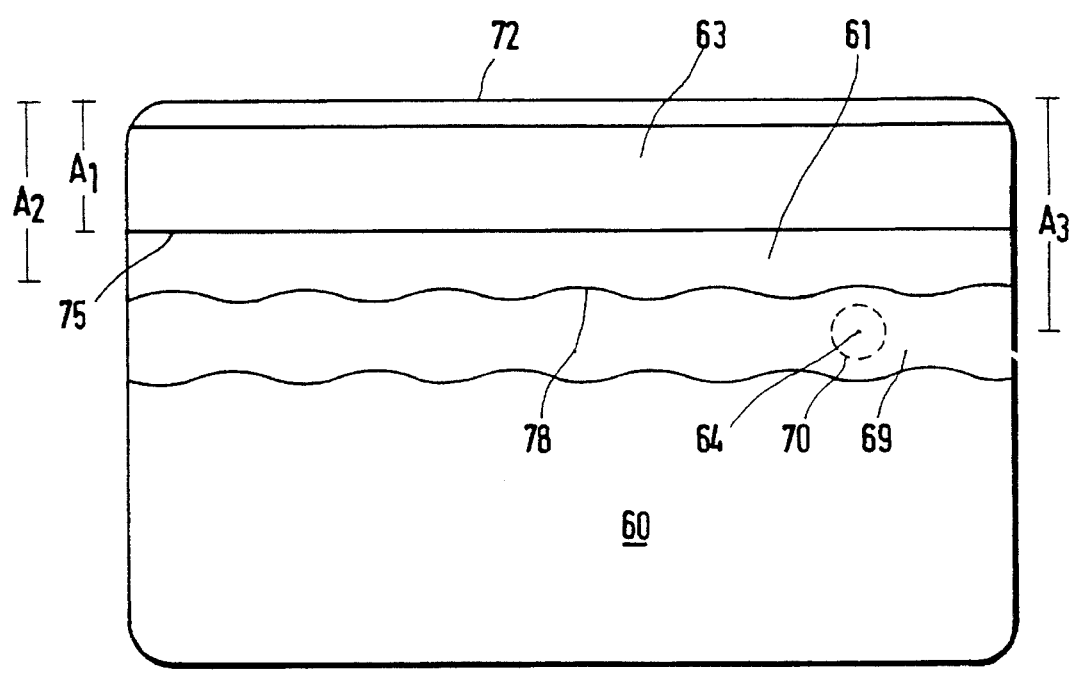
FIG. 8 shows the card body of FIG. 7 in a front view.

A card with an inserted carrier element is shown in FIGS. 7 and 8. A further special feature of the card body shown in FIGS. 7 and 8 and often used today is, according to a development of the invention, that the bottom of the recess for the carrier element protrudes into the transparent cover film on the back of the card in the card structure having cover films applied to the front and back. The multistep recess is designed such that the area protruding into the transparent layer on the back is invisible due to an element placed on the back, for example a signature stripe. This ensures, among other things, that the visual appearance of the card is not impaired despite the greatest possible utilization of the card thickness available for the recess.

The card shown in FIGS. 7 and 8 is often used today for bank applications. It comprises a multilayer card body 60, a magnetic stripe 63 and a signature stripe 69. The card body is constructed of four equally thick layers 81, 82, 83, 84. The front and back of the card are formed by transparent layers 81, 84. Intermediate layers 82, 83 are opaque and generally printed.

Magnetic stripe 63 on the back of the card has several write-read tracks. The data required for the application the card are stored in these tracks. Magnetic stripe 63 is parallel to the upper edge of the card, distance A1 between longitudinal edge 72 of the card and lower edge 75 of the magnetic stripe being prescribed by an ISO standard. The signature stripe preferably comprises a thin paper layer and is aligned below magnetic stripe 63 at a distance A2 to the longitudinal edge of the card and parallel to this edge.

To ensure correct writing and reading of the magnetic stripe and due to esthetic considerations it is recommendable to provide a certain distance between the lower edge of the magnetic stripe and upper limitation 78 of signature stripe 69. These considerations define distance A2, that is thus clearly greater than distance A1. An uncovered transparent area 61 thus remains between the magnetic stripe and signature stripe 69.

The chip module comprises a substrate with contact surfaces 9 and integrated circuit 7 disposed on opposite sides thereof. Integrated circuit 7 and the connecting lines from the circuit to the contact surfaces (not shown in the figure) are surrounded protectively by a casting compound 87. A multistep recess is milled into the card body to take up the chip module. The step in the front of the card body serves as an adhesive surface for the substrate of the chip module, while the two remaining steps limit a recess 86 for taking up the casting compound.

For incorporation in the card body one customarily uses chip modules in which the integrated circuit is disposed centrally on a contact layout located on a substrate. This structure not only facilitates the assembly of the integrated circuit and its encasing with a casting compound, it is also advantageous with respect to the unavoidable bending stresses acting on the module.

Since the position of the contact layout on the card surface is prescribed by an ISO standard the center of the recess relative to the card edges is also defined using a chip module with a centrally disposed integrated circuit. FIG. 8 shows the bottom of the recess by a broken line. The distance between the center of the recess and the upper card edge is referred to as A3.

The incorporation of chip modules wherein the integrated circuit and thus the casting compound is located in the center of the contact layout requires a deep recess that is preferably rotationally symmetrical to center 64. The deepest area of this recess protrudes into transparent back 60 due to the special card structure of the customary cards so that the rather membrane-like bottom recess consists solely of transparent material. If the transparent membrane, that is rotationally symmetrical to center 64, is selected too large it is not completely covered by signature stripe 69. Part of the membrane instead lies in transparent area 61 between magnetic stripe 63 and signature stripe 69 so that the casting compound of the chip module can be seen when one looks at the back the card. This impairs the visually esthetic impression of the card. To give the card with an integrated chip module a perfect visual impression one should thus make the maximum dimensions of the membrane such that peripheral line 70 is completely covered by the signature stripe, even when the membrane coincides with a narrow area of the wavy signature stripe whose position also varies from card to card. On the other hand, the recess should be formed such that a cavity remains between the wallings of the recess and casting pellet 87. This cavity can be utilized to take up process tolerances. Furthermore, a cavity improves the mechanical properties of the module against bending stresses on the card.

To permit optimal utilization of the advantageous properties of recess 86, on the one hand, and give the card with an integrated chip module a perfect visual appearance, on the other hand, one should dimension the lower part or bottom of recess 86 such that it is as large as possible and rotationally symmetrical but is completely covered by the signature stripe. This is achieved if transition 92 from the second step plateau to the bottom of the recess is covered completely by the signature stripe at least in the area of the transparent layer. In this case one can see from the back of the card neither the part of the transition located in the transparent layer nor the membrane itself, whose border is fixed by the transition.

Finally, it should be mentioned that the form of the chip module and the form of the recess are selected only by way of example. Any other desired forms are conceivable. All conceivable forms must meet only the condition that the area of the recess located in the transparent back is covered by the signature stripe or another covering element.

We claim:

1. A method for incorporating in a card body a carrier element with at least one integrated circuit disposed on a substrate, the carrier element being connected with the card body in a recess in the card with the aid of a contact adhesive element under the action of pressure, comprising the following steps:

feeding a contact adhesive tape in the form of endless material, said tape comprising a double-sided contact adhesive film disposed on a carrier film;

fabricating individual contact adhesive elements in accordance with the dimensions of the adhesive surface provided for the bond between the carrier element and the card body from the contact adhesive film of the contact adhesive tape by means of a cutting tool;

transferring a contact adhesive element formed by the preceding step from the carrier film into the recess in the card body by means of a suitable die with the carrier film between the die and the contact adhesive element, and with one side of the contact adhesive element in direct adhesive contact with the recess;

feeding to the recess area a carrier film comprising a substrate with integrated circuits mounted thereon in the form of endless material, whereby the integrated circuits can be surrounded for better protection by a casting compound;

stamping a carrier element with at least one integrated circuit out of the carrier film and placing it in the recess in the card body in adhesive engagement with the contact adhesive element.

2. The method of claim 1, wherein the step of fabricating the individual contact adhesive elements includes the steps of:

feeding a contact adhesive tape in the form of an endless material, said tape comprising a double-sided contact adhesive film disposed on the carrier film and covered by a protective film;

stamping out the areas of the contact adhesive tape not required as adhesive surfaces for connecting the carrier elements with the card bodies;

removing the protective film from the contact adhesive tape and winding it onto a roll;

cutting the contact adhesive film at regular intervals in exact register in accordance with the dimensions of the adhesive surfaces provided for the bond between the carrier elements and the card bodies by means of a cutting tool to obtain the individual contact adhesive elements.

3. The method of claim 1, wherein the step of fabricating the contact adhesive elements includes the steps of:

feeding a contact adhesive tape in the form of an endless material, said tape comprising a double-sided contact adhesive film disposed on the carrier film and covered by a protective film;

stamping out the areas of the contact adhesive tape not required as adhesive surfaces for connecting the carrier elements with the card bodies;

removing the protective film from the contact adhesive tape and winding it onto a roll;

cutting the contact adhesive film in accordance with the contour of the adhesive surfaces provided for the bond between the carrier elements and the card bodies by means of a cutting tool such that the adhesive surfaces are surrounded by a lattice;

removing the lattice to obtain the individual contact adhesive elements remaining isolated on the carrier film at regular intervals.

4. The method of claim 3, including the step of stamping T-shaped relief openings into the carrier film of the contact adhesive tape between the isolated contact adhesive elements after the latticed contact adhesive film is removed.

5. The method of claim 2 or 3, including the step of stamping circular openings in the contact adhesive tape in the center area and/or indents at the edges.

6. The method of claim 5, including the step of using the circular stamped openings for clocked transport and for positioning of the contact adhesive tape.

7. The method of claim 2, wherein a contour of the stamped out areas of the contact adhesive tape is slightly larger than a contour of the contact adhesive elements.

8. A method for incorporating in a card body a carrier element with at least one integrated circuit disposed on a substrate, the carrier element being connected with the card body in a recess in the card with the aid of a contact adhesive element under the action of pressure, comprising the following steps:

feeding a contact adhesive tape in the form of endless material, said tape comprising a double-sided contact adhesive film disposed on a carrier film;

fabricating individual contact adhesive elements in accordance with the dimensions of the adhesive surface provided for the bond between the carrier element and the card body from the contact adhesive film of the contact adhesive tape by means of a cutting tool;

stamping an individual contact adhesive element together with a corresponding contoured part of the carrier film as a protective element out of the contact adhesive tape;

transferring an individual contact adhesive element covered by the protective element into the recess in the card with one side of the contact adhesive element in direct adhesive contact with the recess;

removing the protective element from the side of the contact adhesive element opposite the recess;

feeding to the recess area a carrier film comprising a substrate with integrated circuits mounted thereon in the form of endless material, whereby the integrated circuits can be surrounded for better protection by a casting compound;

stamping a carrier element with at least on integrated circuit out of the carrier film and placing it in the recess in the card body in adhesive engagement with the contact adhesive element.

9. The method of claim 8, wherein fabricating the individual contact adhesive elements includes the steps of:

feeding a contact adhesive tape in the form of an endless material, said tape comprising a double-sided contact adhesive film disposed on the carrier film and covered by a protective film;

stamping out the areas of the contact adhesive tape not required as adhesive surfaces for connecting the carrier elements with the card bodies;

removing the protective film from the contact adhesive tape and winding it onto a roll;

cutting the contact adhesive film at regular intervals in exact register in accordance with the dimensions of the adhesive surfaces provided for the bond between the carrier elements and the card bodies by means of a cutting tool to obtain the individual contact adhesive elements.

10. The method of claim 8, wherein the step of fabricating the contact adhesive elements includes the steps of:

feeding a contact adhesive tape in the form of an endless material, said tape comprising a double-sided contact adhesive film disposed on the carrier film and covered by a protective film;

stamping out the areas of the contact adhesive tape not required as adhesive surfaces for connecting the carrier elements with the card bodies;

removing the protective film from the contact adhesive tape and winding it onto a roll;

cutting the contact adhesive film in accordance with the contour of the adhesive surfaces provided for the bond between the carrier elements and the card bodies by means of a cutting tool such that the adhesive surfaces are surrounded by a lattice;

removing the lattice to obtain the individual contact adhesive elements remaining isolated on the carrier film at regular intervals.

11. The method of claim 10, including the step of stamping T-shaped relief openings into the carrier film of the contact adhesive tape between the isolated contact adhesive elements after the latticed contact adhesive film is removed.

12. The method of claim 9 or 10, including the step of stamping circular openings in the contact adhesive tape in the center area and/or indents at the edges.

13. The method of claim 12, including the step of using the circular stamped openings for clocked transport and for positioning of the contact adhesive tape.

14. The method of claim 12, wherein the contour of the stamped out protective element is slightly larger than the contour of the contact adhesive element.

* * * * *